US008282010B2

United States Patent
Heusmann

(10) Patent No.: US 8,282,010 B2
(45) Date of Patent: Oct. 9, 2012

(54) SECURITY ELEMENT WITH IC CARD

(75) Inventor: Hans Heusmann, Egenhogen (DE)

(73) Assignee: Giesecke & Devrient GmbH, Munich (DE)

( * ) Notice: Subject to any disclaimer, the term of this patent is extended or adjusted under 35 U.S.C. 154(b) by 550 days.

(21) Appl. No.: 12/432,327

(22) Filed: Apr. 29, 2009

(65) Prior Publication Data

US 2009/0272813 A1 Nov. 5, 2009

Related U.S. Application Data

(60) Provisional application No. 61/129,559, filed on Jul. 3, 2008.

(30) Foreign Application Priority Data

Apr. 30, 2008 (DE) .......................... 10 2008 021 519

(51) Int. Cl.
*G06K 19/06* (2006.01)
(52) U.S. Cl. .......................... 235/492; 235/486; 235/487
(58) Field of Classification Search .................. 235/486, 235/487, 492
See application file for complete search history.

(56) References Cited

U.S. PATENT DOCUMENTS

| 6,561,432 | B1 * | 5/2003 | Vedder et al. ................. 235/492 |
| 6,685,097 | B1 * | 2/2004 | Housse .......................... 235/492 |
| 6,964,377 | B1 * | 11/2005 | Haghiri et al. ................ 235/492 |
| 7,264,172 | B2 | 9/2007 | Amiot et al. |
| 7,630,203 | B1 * | 12/2009 | Chen et al. .................... 361/737 |
| 7,770,800 | B2 * | 8/2010 | Martinez et al. ............. 235/486 |
| 2002/0050527 | A1 * | 5/2002 | Nishikawa et al. ........... 235/492 |
| 2002/0160630 | A1 * | 10/2002 | Kashima ......................... 439/55 |
| 2007/0125866 | A1 * | 6/2007 | Nishizawa et al. ........... 235/492 |
| 2007/0267503 | A1 * | 11/2007 | Dewan .......................... 235/487 |
| 2008/0251587 | A1 * | 10/2008 | Martinent et al. ............ 235/492 |
| 2009/0065587 | A1 * | 3/2009 | Phillips ......................... 235/492 |

\* cited by examiner

*Primary Examiner* — Ali Sharifzada
(74) *Attorney, Agent, or Firm* — Bacon & Thomas, PLLC

(57) ABSTRACT

A security element has a housing assembled from two housing members, and an IC card placed between the two housing members. The IC card is a detachable part of a larger base card within which it is disposed in a recess and to which it is connected via bars provided with a rated breaking point. The internal contour surrounding the recess in the base card encloses a surface area which is equal to or larger than the cross-sectional area of the housing at the level of the seat. The assembly of the security element can be so carried out that the IC card is broken out of the base card only after the housing members are joined to form the finished housing.

11 Claims, 2 Drawing Sheets

SECURITY ELEMENT WITH IC CARD

CROSS REFERENCE TO RELATED APPLICATIONS

This application claims priority to U.S. provisional application Ser. No. 61/129,559 filed on Jul. 3, 2008 and Germany application DE 10 2008 021 519.8 filed on Apr. 30, 2008.

FIELD OF THE INVENTION

This invention relates to a security element designed in the manner of a portable article of daily use and mounted by means of an IC card, and to a method for mounting such a security element. The invention relates in particular to a token in the form of a key pendant which substantially comprises a housing into which a non-standard chip card is inserted, and to its assembly.

BACKGROUND

A security device of this kind is known for example under the designation "SideCard" from the company MASTERCARD. The known device comprises a substantially L-shaped frame with a channel profile whose legs encompass a long and a short side of a contactless-type chip card in a non-standard format. The card is connected via a swivel joint on the short leg of the L-shaped frame to the latter and can be swiveled into or out of the frame in the manner of a razor blade; in the swiveled-out state the card is then almost completely visible. On the short leg of the frame there is further provided on the outer side an eyelet which permits the total device to be fastened to a key ring. The device can be used intuitively, but is susceptible to damage via the joint and the exposed card sides. To attain a long life, high-quality materials must be used and careful production is required.

U.S. Pat. No. 7,264,172 B further discloses a security device comprising a pocketlike housing into which an IC card is inserted that has previously been detached from a larger base card. At a narrow head end of the housing a recess is formed by means of which the housing, after insertion of an IC card, can be fastened to a bunch of keys. In an outer surface of the pocketlike housing, a window is further formed so that the IC card is exposed therebelow in the inserted state. To provide the IC card required for this known device it is possible to use known techniques for producing standard chip cards. The production of the security devices can therefore be effected economically. When the device is mounted by an end user, however, there is a danger of the user damaging the IC card when breaking it out of the larger carrier card or of inserting it into the housing wrong. Although such user errors can be avoided completely or partly by constructional or instructive measures, e.g. by detailed operating instructions, this increases the production cost. The assembly of the security device could also already be effected in the course of production prior to delivery to the end user, but this involves a further production step and thus likewise increases the cost.

SUMMARY

It is the object of the invention to specify a security element based on an IC card, which can be favorably produced and which can be mounted in damage-proof fashion.

The inventive solution is based on the approach of forming a detachable insertion card in a base card while leaving a specially designed recess, said insertion card constituting, after incorporation into a housing, a security element together therewith. According to the invention, the surface area enclosed by the recess is larger than the cross-sectional area of the housing in the area where the insertion card is received. The inventive structure of the security element has the advantage that the outside portion of the base card can be separated after the insertion card has been incorporated into the housing, which at the same time facilitates separation and reduces the danger of damage to the insertion card. In particularly advantageous fashion, the security element can be pre-assembled by the issuer mounting the housing, without requiring the elaborate single step of breaking the insertion card out of the base card. It is particularly advantageous here that the housing can first be mounted on a base card in a standard format, e.g. the ID-1 format. For standard formats, unlike non-standard formats, it is possible to use existing production technologies, thereby facilitating pre-assembly by machine. The potentially elaborate development of new processes for dealing with a non-standard format is avoided. If the final assembly of the security element is left to the end user, on the other hand, the suitable design of the recess permits an intuitively correct assembly of the individual parts of the security element. Since the outside portion is separated only in a last step from the security element after complete assembly thereof it is further advantageously possible to provide instructions on the outside portion that give assembly information to an end user and for example unambiguously indicate the position of a certain housing part.

Advantageous developments and expedient embodiments of the invention can be found in the features stated in the subclaims.

BRIEF DESCRIPTION OF THE DRAWINGS

With reference to the drawings an exemplary embodiment of the invention will hereinafter be explained more precisely. Therein is shown FIG. 1 a base card with an insertion card formed therein in a top view, FIG. 2 a base card with a housing comprising two halves in an exploded view in longitudinal cross section along the center axis, FIG. 3 a ready assembled security element prior to separation of the outside portion of the base card in cross section, and FIG. 4 a security element after removal of the outside portion in cross section.

DETAILED DESCRIPTION OF EXEMPLARY EMBODIMENTS OF THE DISCLOSURE

Figure 1:
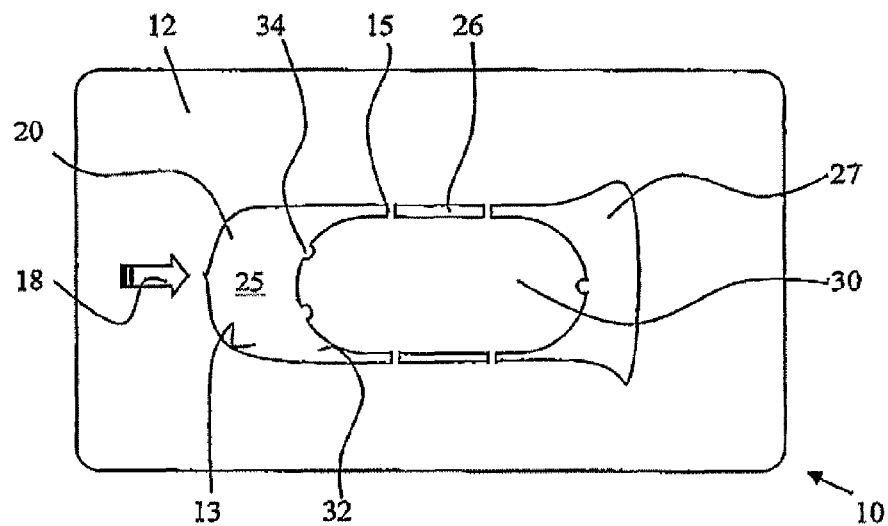

The base card 10 shown in FIG. 1 comprises a card body preferably made of plastic with a thickness D in a production-friendly format, e.g. the ID-1 format standardized for chip cards. The base card 10 is divided into an insertion card 30 and an outside portion 12 surrounding the insertion card 10 and referred to hereinafter as the surrounding card. The insertion card 30 is a per se known IC card and comprises an IC with a contact-type or contactless interface. Insertion card 30 and surrounding card 12 are separated by a recess 20 which, interrupted only by at least one bar 15, encloses the insertion card 30. The recess 20 is limited on the one hand by the internal contour 13 of the surrounding card 12 and on the other hand by the external contour 32 of the insertion card 30. It possesses an asymmetric form with respect to the traverse axis of the base card 12 and is divided into a large-surface head area 25, a likewise large-surface foot area 27 and a transition zone 26 of smaller surface in comparison thereto along the longitudinal edges of the insertion card 30. Insertion card 30 and surrounding card 12 are interconnected via the at least one bar 15. Bars 15, insertion card 30 and surrounding card 12 are formed from a single base card 10 and constitute one unit of material.

The internal contour 13 of the surrounding card 12 matches the circumferential contour of a housing 60 with which the insertion card 30 is mounted to form a security element 1. The internal contour 13, and thus the recess 20, expediently possesses an asymmetric shape at least with respect to one axis, said shape unambiguously defining the alignment of the corresponding housing 60 when the latter is laid on. The insertion card 30 is expediently so formed that it can be assigned a longitudinal and a traverse axis; point-symmetric shapes are nevertheless possible. The insertion card 30 possesses an external contour 32 freely formed independently of the internal contour 13 and matching a seat 46 in a housing 60 with which it is mounted to form a security element 1. Along the external contour 32 of the insertion card 30 notches 34 are formed, expediently in an unambiguous arrangement with respect to one direction, which serve to align and fix the insertion card 30 in a seat 46. It is possible to provide a plurality of notches 34, as indicated in FIG. 1, but they can also be omitted.

Insertion card 30 and surrounding card 12 are interconnected via at least one, but preferably, as indicated in FIG. 1, a plurality of narrow bars 15. The bars 15 possess rated breaking points 16 and are so formed that the connection of surrounding card 12 and insertion card 30 is on the one hand so firm that the insertion card 30 is not detached from the surrounding card 12 upon proper handling either prior to delivery to an end user or during assembly, and on the other hand so weak that a separation of the surrounding card 12 and the insertion card 30 is possible any time upon selective application of small forces by an end user. For realizing the rated breaking points the bars 15 preferably have geometric designs (not specifically shown), e.g. horizontal and/or vertical weakenings of material and/or a specially designed fine contouring. The bars 15 are expediently formed along the longitudinal edges of the insertion card 30. Suitable arrangement and formation of the bars 15 are per se known, however, so that this will not be dealt with further here.

Figure 2:
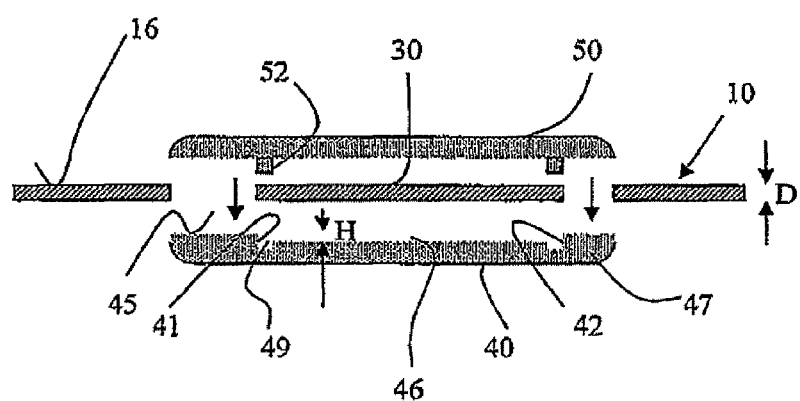

A housing 60 corresponds to the form given by the internal contour 13 of the recess 20 and the external contour 32 of the insertion card 30, as illustrated in FIG. 2. It comprises a half-shell-like lower housing 40 and a likewise half-shell-like upper housing 50 which are made of plastic and connected on their inside edges preferably in form-fitting fashion. The housing 60 is higher than the insertion card 30 and encloses an installation space in which the insertion card 30 is preferably completely received. It is expediently designed in the manner of a key or key pendant and can have an opening (not shown) at a suitable place to permit attachment to a bunch of keys. The housing 60 can be configured to be transparent, so that the insertion card 30 is visible, or to be wholly or partly colored opaque.

The housing members 40, 50 are so designed as to lie against each other over a joining surface which is constituted in part by the surface of an insertion card 30 placed between the housing members 40, 50. The joining surface can coincide completely with a surface 16 of the base card 10, as indicated in FIG. 2. Besides that, designs of the housing members 40, 50 that produce a stepped joining surface are possible.

Along the joining surface, the circumferential contour of the housing 60 expediently corresponds in an accurate fit to the internal contour 13 of the surrounding card 12, so that the cross-sectional area of the housing 60 corresponds exactly to the surface area of the recess 20 with the insertion card 30 at the level where the joining surface is constituted by the insertion card 30; the housing 60 preferably possesses its greatest cross-sectional area on the joining surface at the level of the part constituted by the insertion card 30. Lower housing 40 and upper housing 50 are interconnected by a connection system which can be constituted, as indicated in FIG. 2, by pins 52 in one housing member and corresponding depressions 49 in the other housing member.

Adjacent to the joining surface, the lower housing 40 has in the center an area 46 that is deepened via edge steps 41, 42 with respect to the joining surface and constitutes a seat for an insertion card 30. The height H of the edge steps 41, 42, or depth of the seat 46, preferably corresponds exactly to the thickness D of the card body of the base card 10. The seat 46 divides the lower housing 40 in longitudinal cross section, as shown in FIG. 2, into three areas, namely an elevated bow area 45, the seat 46 in the middle, and an elevated rear area 47. Bow area 45 and rear area 47 are so formed as to fit into the head area 25 and foot area 27, respectively, of the recess 20 in the base card 10. The circumferential contour of the lower housing 40 in the bow area 45 and in the rear area 47 preferably follows the internal contour 13 of the surrounding card 12 in an accurate fit. The circumferential contour in the area of the seat 46 also expediently corresponds exactly to the internal contour 12 of the surrounding card 12. However, since the joining surface in the area of the seat 46 is located below the plane of the base card 10, the form of the lower housing 40 here can also deviate wholly or partly from the form given by the internal contour 13, and in particular enclose a smaller surface area. In one variant the seat 46 can also be surrounded by a wall interrupted only at the positions of the bars 15 and whose height corresponds to the edge steps 41, 42. The circumferential contour of the lower housing 40 then expediently follows the internal contour 13 in an accurate fit in the transition zone as well, as in the bow area 45 and in the rear area 47; the width of the wall expediently corresponds to the length of the bars 15. The design of the lower housing 40 is therefore such that a base card 10 can be placed thereon whereby the insertion card 30 contained in the base card 10 comes to lie in the seat 46 and the bow area 45 and rear area 47 of the lower housing 40 engage the head area 25 and foot area 27 of the recess 20, respectively. At the transition between seat 46 and bow or rear area, depressions 49 are formed in the seat 46 beside the edge steps 41, 42, said depressions being counterparts to the pins 52 formed in the upper housing 50. The positioning of the depressions 49 within the seat 46 corresponds exactly to the positions of the notches 34 in the external contour 32 of the insertion card 30.

The upper housing 50 is intended to be connected to the lower housing 40, and preferably possesses the same circumferential contour at least along the joining surface as the lower housing 40. That is, on the joining surface the external contour of the upper housing 50 expediently follows the internal contour 13 of the surrounding card 12 in an accurate fit. The inner side of the upper housing 50 facing the lower housing 40 can be of flat configuration, as indicated in FIG. 2. Corresponding to the depressions 49, pins 52 projecting from the inner side are formed which lock into the depressions 49 and constitute a connection system therewith upon mounting of the housing 60.

Figure 3:
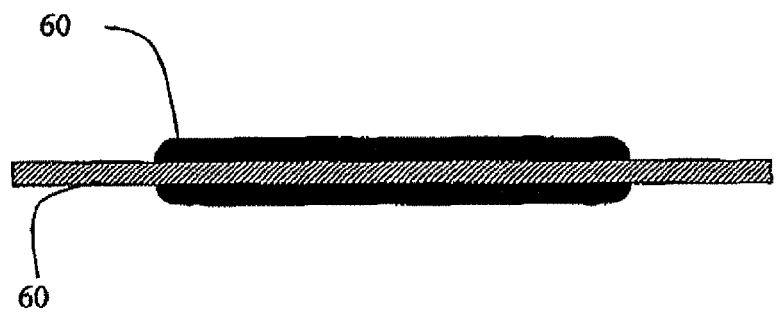
Figure 4:
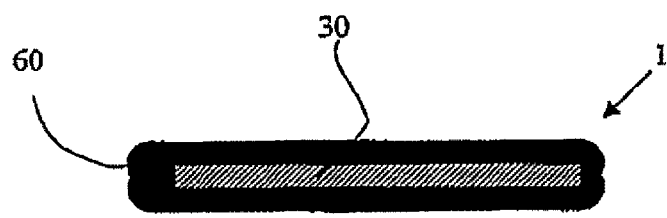

FIGS. 3 and 4 illustrate one possibility for the assembly of a security element 1 from a base card 10, a lower housing 40 and an upper housing 50. The base card 10 is first placed over the lower housing 40 such that the insertion card 30 comes to lie in the seat 46. The simultaneous cooperation of the external contour of the lower housing 40 with the internal contour 13 of the surrounding card 13 and the external contour 32 of the insertion card 30 with the edge steps 41, 42 of the seat 46 unambiguously defines the relative positions of lower housing 40 and base card 10 upon joining. The insertion card 30 thus always comes to lie in the seat 46 in the right position.

To further ensure that the joining of insertion card 30 and lower housing 40 is effected correctly in the prescribed manner, there can be provided on the surface 16 of the surrounding card 12 a graphic marking 18, e.g. in the form of an arrow as indicated in FIG. 1, which corresponds to a corresponding marking on the lower housing 40. To further support the assembly, textual instructions explaining the assembly can furthermore also be provided on the surface 16 of the surrounding card 12.

The semifinished product constituted by the base card 10 and the lower housing 40 joined thereto is subsequently connected to the upper housing 50. The upper housing 50 is for this purpose placed on the facing away side of the base card 10 above the recess 20 such that the pins 52 engage the notches 34 and the subjacent depressions 49 of the lower housing 40. In the bow area 45 and rear area 47, lower housing 40 and upper housing 50 thereafter lie directly one on the other. In the area of the seat 46 the insertion card 30 is clamped between lower housing 40 and upper housing 50. Via the bars 15 it is still connected to the surrounding card 12 which, as shown in FIG. 3, surrounds the now assembled housing 60 in the manner of a stencil.

The surrounding card 12 is then removed. This is done, upon use of a bar arrangement as indicated in FIG. 1, for example by rotating the surrounding card 12 against the housing 60 around a traverse axis of the insertion card 30 or the housing 60 so that the bars 15 tear at the rated breaking points. The final result, as shown in FIG. 4, is a security element 1 with a sandwich structure whereby the insertion card 30 is clamped in this way in form-fitting fashion between lower housing 40 and upper housing 50. The lateral longitudinal edges of the insertion card 30 are exposed, as shown in FIG. 4; in case of a corresponding design of the housing members 40, 50 or the connection mechanism, however, they can also be partly or completely covered.

Obviously, the assembly of the security element 1 can also be begun by placing the upper housing 50 on the base card 10. Further, the removal of the surrounding card 12 can already be effected after connection to only one housing member.

The assembly of the security element 1 from housing members 40, 50 and base card 10 is expediently effected by an end user who is provided for this purpose with the base card 10 and the two housing members 40 and 50. In an advantageous variant it is provided that the manufacturer of the security element 1 already joins the housing members 40, 50 prior to delivery to an end user while leaving the surrounding card 12 connected to the insertion card 30. The thus formed semifinished product is delivered to the end user; the end user removes the surrounding card 12.

While retaining the basic idea of a base card 10 with a detachable insertion card 30 formed therein being so designed by a special execution of the recess 20 separating the surrounding card 12 and the insertion card 30 that the insertion card 30 can be provided with a housing 60 while still in the base card 10, the above-described solution allows a multiplicity of implementation variants, Thus, the housing 60 can of course possess a different form from that of a key or key pendant and be designed for example in the manner of a pen or bracelet. Further, the roles of upper and lower housing can readily be reversed. It is likewise possible to distribute individual design features over both housing members 40, 50. For example, each housing member 40, 50 can have one half of a seat with a depth T=H/2 and the design of bow part 45 and rear part 47 be effected such that an insertion card 30 placed between the two housing members 40, 50 is received partly by each of them. It is further possible that the form selected for the internal contour 13 or external contour 32 is not an axisymmetric geometry but any other one, e.g. also a point-symmetric one. Instead of or in addition to notches 34 it is also possible to provide holes in the insertion card 30 which are engaged by corresponding pins 52. At least one hole expediently possesses a non-point-symmetric form so that the alignment of a pin 52 engaging the recess, and thus the position of the insertion card 30 relative to the seat 46, is unambiguously defined. Further, the housing 60 can also comprise more than two members and the circumferential contour can follow any line between internal contour 13 of the surrounding card 12 and external contour 32 of the insertion card 30. Instead of depressions 49 and pins 52, it is possible to use another connection system for connecting lower housing 40 and upper housing 50, for example one based on edge clamping or a connection by means of screws provided for this purpose. The connection of lower housing 40 and upper housing 50 can also be effected via a hinge to which the two housing members are first to be connected. After production of the hinge joint the housing members can then be folded together. The connection can further be configured to be detachable or undetachable or only destructively detachable.

LIST OF REFERENCE SIGNS

1 Security element
10 Base card
12 Surrounding card
13 Internal contour
15 Bar
16 Surface
18 Markings
20 Recess
25 Head area
26 Transition zone
27 Foot area
30 Insertion card
32 External contour
40 Lower housing
41 Edge step
42 Edge step
45 Bow area
46 Seat
47 Rear area
49 Depressions
50 Upper housing
52 Pin
60 Housing

The invention claimed is:

1. A security element comprising;
a base card having a recess surrounding an IC card detachable from the base card;
a housing comprising at least a first and second housing member, wherein said first or second housing member has an area arranged to engage the recess of the base card, and wherein said first or second housing member is arranged to form a seat aligned with the IC card; and
the IC card being at least partly enclosed by the first and second housing members of the housing and aligned in the seat formed in the housing, said IC card being connected to said base card by at least one bar provided with a rated breaking point and surrounded by the recess, wherein an internal contour surrounding the recess in the base card encloses a surface area which is equal to or larger than a cross-sectional area of the housing at a level of the seat.

2. The security element according to claim 1, wherein the IC card is contactless.

3. The security element according to claim 1, wherein one of the housing members is configured as a half-shell with a joining surface pointing to the other housing member, and the seat is formed as an area that is deepened with respect to the joining surface.

4. The security element according to claim 1, wherein a depth of the seat corresponds to a thickness of the base card.

5. The security element according to claim 1, wherein a surface area of the seat corresponds to a surface area of the IC card.

6. The security element according to claim 1, wherein the housing members each have corresponding elements of a mechanical connection system which allows a permanent connection of the housing members.

7. The security element according to claim 6, wherein the IC card has at least one notch on an external contour thereof and/or a recess in a surface area thereof through which the connection system engages.

8. The security element according to claim 7, wherein said at least one notch or recess has a non-rotationally symmetric form, or at least two of said notches or recesses are provided in a non-rotationally symmetric arrangement, which unambiguously define a position of the IC card relative to the seat at least with respect to one axial direction.

9. The security element according to claim 1, wherein a circumferential contour of the housing has an asymmetric form at least with respect to one axis, said form unambiguously defining a position of the housing members relative to each other at least with respect to said one axis.

10. The security element according to claim 1, wherein the housing has a circumferential contour corresponding in an accurate fit to the internal contour limiting the recess in the base card.

11. A method for making a security element comprising the steps of:

providing a housing having a seat for an IC card, said housing comprising a first and second housing member, wherein said first or second housing member has an area arranged to engage the recess of the base card, and wherein said first or second housing member is arranged to form a seat aligned with the IC card;

providing a base card having a recess surrounding said IC card, said recess being larger than a cross-sectional area of the housing at a level of the seat and said IC card being connected to the base card only via bars provided with a rated breaking point; and connecting the base card and the housing so that the IC card is located in the seat of the housing, and arranged in a way such that an outside portion of the base card is detachable from the IC card.

* * * * *